United States Patent [19]

Kawamoto

[11] 4,038,106

[45] July 26, 1977

[54] FOUR-LAYER TRAPATT DIODE AND METHOD FOR MAKING SAME

[75] Inventor: Hirohisa Kawamoto, Kendall Park, N.J.

[73] Assignee: RCA Corporation, New York, N.Y.

[21] Appl. No.: 573,365

[22] Filed: Apr. 30, 1975

[51] Int. Cl.² ............................................. H01L 21/26
[52] U.S. Cl. ..................................... 148/1.5; 148/175; 148/187; 148/33
[58] Field of Search ................................. 148/1.5, 175

[56] References Cited

U.S. PATENT DOCUMENTS

| | | | |
|---|---|---|---|
| 3,638,300 | 2/1972 | Foxhall et al. | 148/1.5 X |
| 3,660,171 | 5/1972 | Tsuchimoto et al. | 148/1.5 |
| 3,745,070 | 7/1973 | Yada et al. | 148/1.5 |
| 3,758,875 | 9/1973 | Hayashi | 148/175 X |
| 3,891,468 | 6/1975 | Ito et al. | 148/1.5 |
| 3,926,693 | 12/1975 | Kawamoto et al. | 148/175 |

Primary Examiner—G. Ozaki
Attorney, Agent, or Firm—H. Christoffersen; Robert P. Williams; William L. Muckelroy

[57] ABSTRACT

A method for making a four-layer P+PNN+ or N+NPP+ diode, and the diode, wherein the impurity profile about the PN junction is optimally graded for TRAPATT operation throughout the span of the avalanche region by ion implantation of the impurities to a depth of 1000A in a semiconductor wafer and wherein these impurities are subsequently thermally diffused.

10 Claims, 11 Drawing Figures

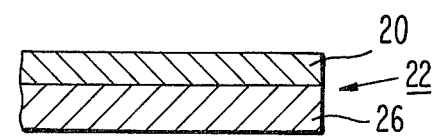
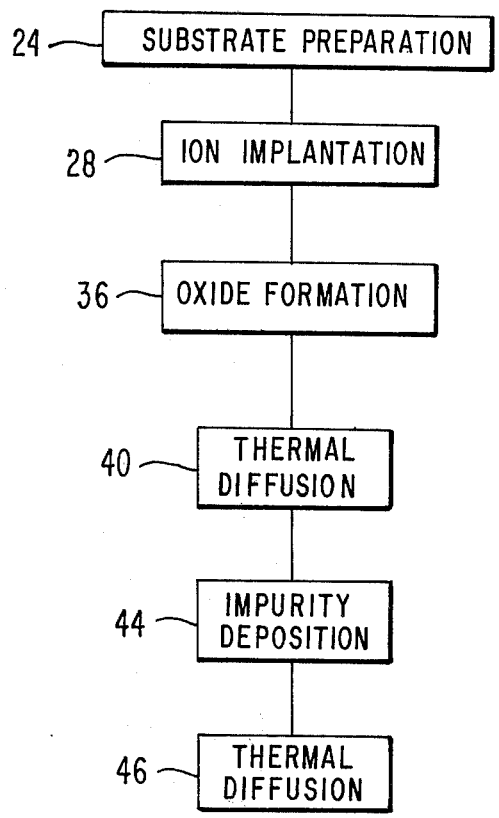
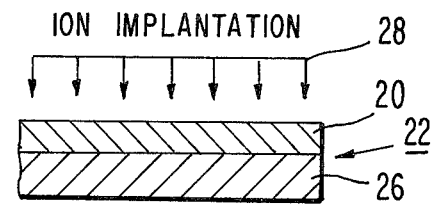
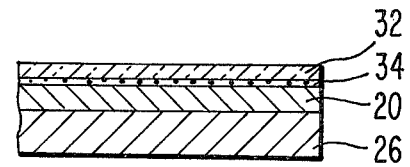
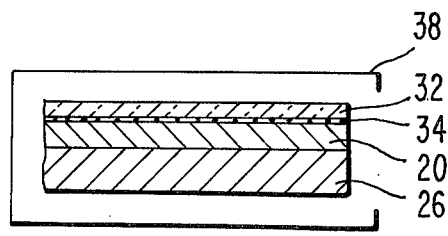
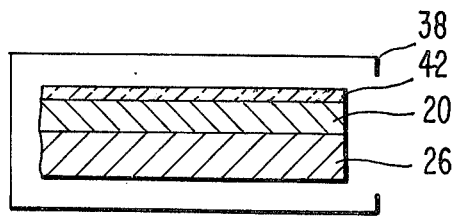
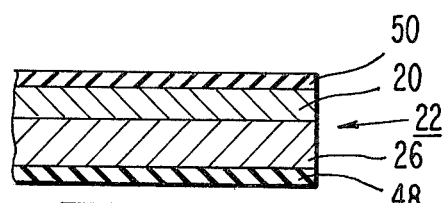

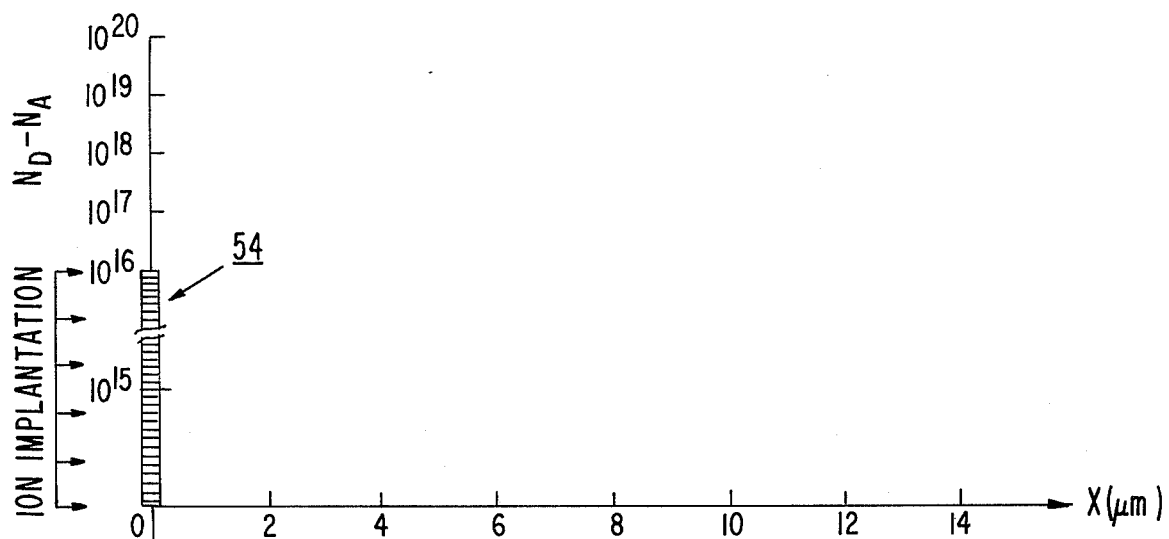
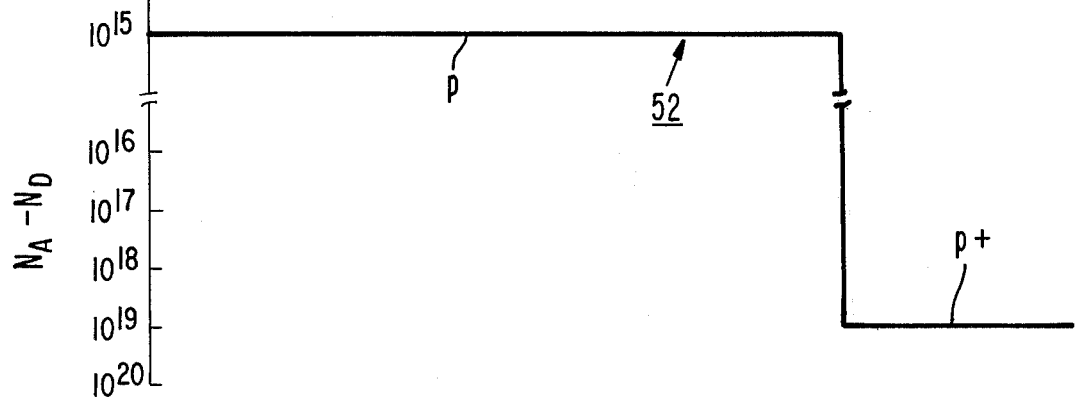
Fig_4a_

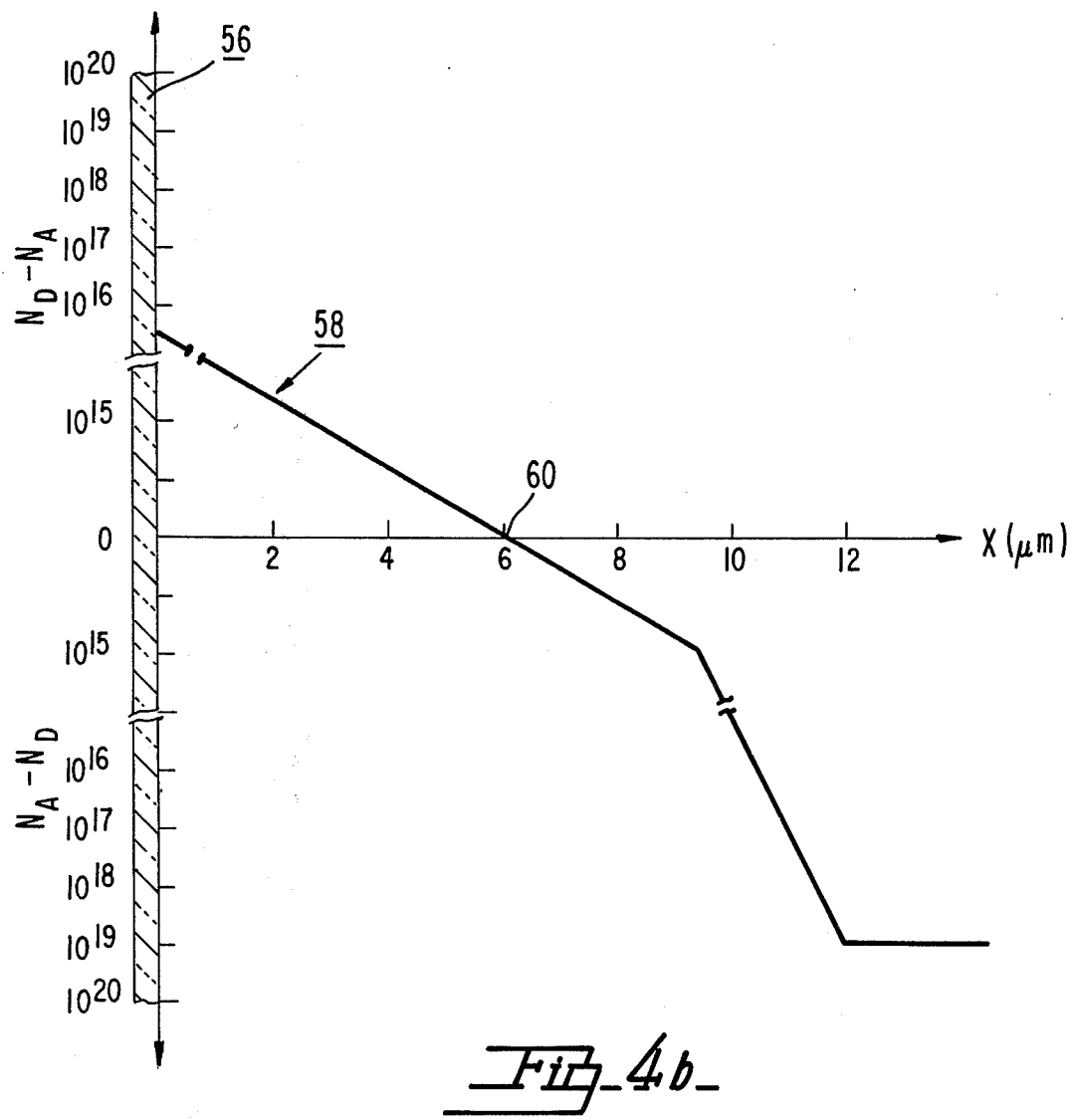
Fig_4b_

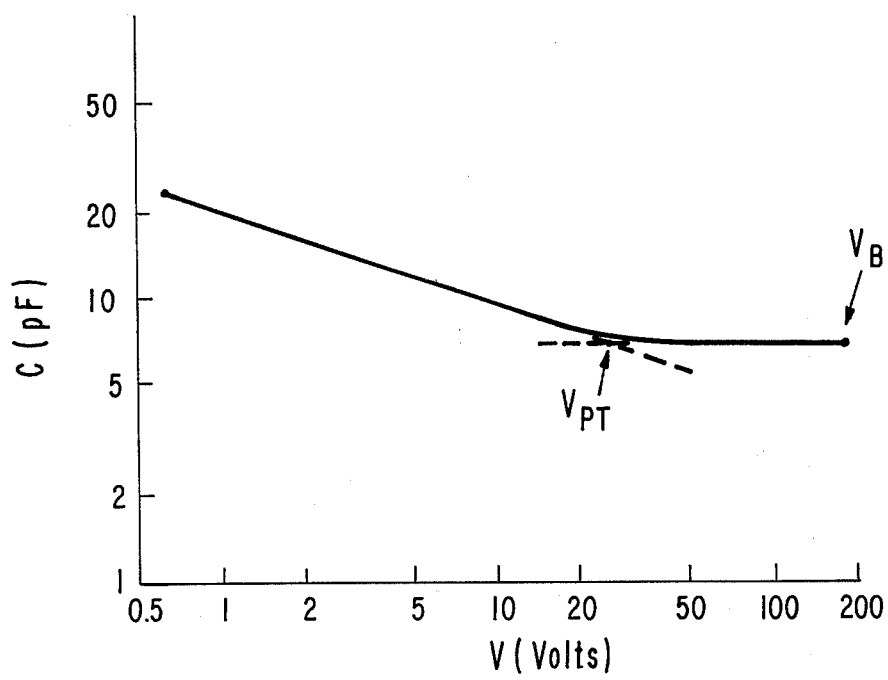
_Fig_5_

FOUR-LAYER TRAPATT DIODE AND METHOD FOR MAKING SAME

The invention herein described was made in the course of or under a contract or subcontract thereunder with the Department of the Army.

This application is related to a commonly assigned patent application of Ser. No. 464,765, filed Apr. 29, 1974 now U.S. Pat. No. 3,926,693.

This invention relates to avalanche diodes and, more particularly, to TRAPATT diodes having four layers and methods for making four-layer diodes which have a graded impurity profile about the PN junction.

The patent of Read, U.S. Pat. No. 2,899,652, describes how a multilayer avalanche diode can be made to present a negative resistance and, when placed in a proper resonant circuit, generate microwave oscillations. An applied direct-current voltage biases a PN junction to avalanche breakdown, thereby creating current pulses each of which travels across a transit region within a prescribed time period. This transit time is arranged with respect to the resonant frequency of the external resonant circuit so that radiofrequency voltages at the diode terminals are out of phase with the current pulses in the diode. With an appropriately designed phase shift, the current through the terminals increases as the voltage across the terminals decreases, thus establishing a negative resistance. Ultimately, part of the directcurrent energy applied to the diode is converted to radiofrequency energy in the resonant circuit and the circuit constitutes a solid-state microwave source.

Improved microwave oscillator avalanche diodes, now normally known as IMPATT diodes, are described in the paper "The IMPATT Diode—A Solid State Microwave Generator", *Bell Telephone Laboratories Record*, by K. D. Smith, Vol. 45, May 1967, p. 144; the paper "Microwave Si Avalanche Diode with Nearly Abrupt Type Junction", *IEEE Transactions on Electron Devices*, Vol. ED-14, Sept. 1967, p. 580; and the patent of W. J. Evans et al., U.S. Pat. No. 3,628,185. The Evans diode is a four-layer device, but the junction of the Evans diode is abrupt and asymmetrical.

The paper of Prager et al. "High-Power High-Efficiency Silicon Avalanche Diodes at Ultra High Frequencies", *Proceedings of the IEEE*, Vol. 55, Apr. 1967, pp. 586–587, describes an IMPATT diode used in an oscillator circuit that gives higher efficiency than would be normally predicted from IMPATT diode theory. The Prager et al. oscillator circuit has been the subject of considerable study, and an analysis of it is described in the paper by Johnston et al., "High Efficiency Oscillations in Ge Avalanche Diodes Below the Transit Time Frequency", *Proceedings of the IEEE*, Vol. 56, Sept. 1968, pp. 1,611–1,613. This high-efficiency oscillator is now known to require a circuit having a high cavity resonance at the normal IMPATT frequency $f_1$, and also a resonance at an output frequency substantially lower than $f_1$. This mode of oscillator operation is known as the TRAPATT mode, an acronym for trapped plasma avalanche triggered transit.

The paper of Kawamoto et al., "P+-Graded Junction—N+ High Efficiency Avalanche (TRAPATT) Diode", *Proceedings of the 5th Convention on Solid State Devices*, Tokyo, Aug. 1973, pp. 246–250, describes a TRAPATT diode with a graded junction which may be produced by either deep boron diffusion on an N−N+ substrate or by shallow phosphorus diffusion onto a P−P+ substrate. The simulations and experiments reported by Kawamoto demonstrated that the graded junction TRAPPAT diode is superior to the abrupt junction type in peak output capability. Although Kawamoto demonstrated theoretically that optimum output power capability in a graded junction TRAPATT diode may be achieved by a particular grading of the impurity profile about the PN junction over a wide depletion layer width, no adequate method for producing such a diode was disclosed.

Kawamoto et al. in the paper "S-Band TRAPATT Amplifiers with Four-Layer Diode Structure", *RCA Review*, Sept. 1974, Vol. 35, No. 3, pp. 372–386, described three methods for making a four-layer diode structure: deep-diffusion, double diffusion, and double epitaxy.

In the deep diffusion method, boron is diffused on an N−N+ epitaxial wafer with an antimony substrate. Although the diodes fabricated by the deep diffusion process demonstrated peak power and broad band width capabilities, the pulse width was very narrow. A deep PN junction results in poor heat dissipation capability. In the deep diffusion process, the active region of the diode (the graded region on either side of the junction) is more than 14$\mu$m below the surface.

The two other techniques which were developed to improve thermal characteristics of the four-layer diode and presented by Kawamoto are double-diffusion and double-epitaxy. Diodes produced by the double-epitaxy process have rather abrupt PN junctions and accordingly, their power output and broad band operation capability are limited. Although the diodes produced by the double-diffusion process exhibit a shallow junction and have graded regions about the junction, the grading is not optimum. Experiments by Kawamoto have indicated that diodes produced by the double-diffusion process have impurity profiles with slopes about the junction which vary from the optimum by at least one order of magnitude. This variance significantly limits the power output, efficiency, and broad band operation of the graded four-layer diode.

The present novel device is a four-layer diode for operation in a TRAPATT mode with the impurity profile about the PN junction having optimum grading throughout the span of the active or avalanche region.

In the drawings:

FIG. 2 is a chart illustration of a method for producing the device of the invention;

FIGS. 3a–3f are partial cross-sectional views illustrating the method of the invention;

FIGS. 4a and 4b are illustrations of the impurity profiles in a device of the invention at different stages of manufacture thereof; and FIG. 5 is a log C-log V plot of a typical diode of the invention.

Figure 1:
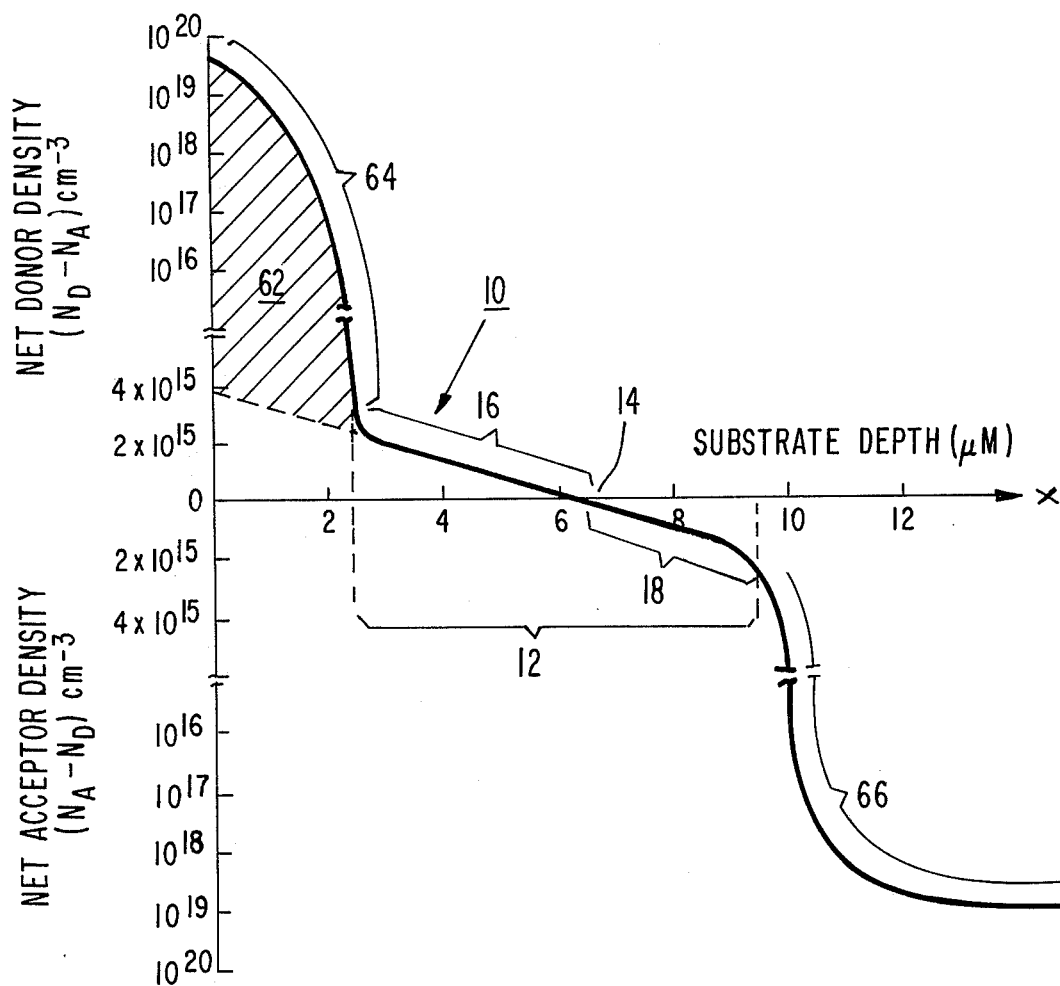
FIG. 1 is an illustration of an impurity profile of a device of the invention.

For optimum efficiency, optimum power output, and broad band operation of a four-layer diode operating in the TRAPATT mode, it is first necessary that the impurity profile throughout the active or depletion region of the TRAPATT diode be graded. Second, it is necessary for this active region to be close to the surface of the diode (for example, at 3 GHz operation, within 10 $\mu$m of the surface). Third, it is necessary that the grading of the impurity profile about the PN junction within the active region have a slope, $\alpha$, which may be calculated from certain equations, namely, the equations for the breakdown voltage and punch-through voltages of a diode.

The breakdown voltage and the punch-through voltage may be expressed, respectively as:

$$V_B = \left(E_c - \frac{q}{\epsilon} \frac{aw^2}{24}\right) w \tag{1}$$

$$V_{PT} = \frac{e}{\epsilon} \frac{aw^2}{12} w \tag{2}$$

where $E_c$ is the critical field for avalanche breakdown, $e$ is the electron charge, $\epsilon$ the dielectric constant of the semiconductor substrate, and $w$ is the width of the active region, i.e., the graded region about the PN junction. The breakdown voltage $V_B$ is a multiple, $\gamma$, of the punch-through voltage $V_{PT}$ in TRAPATT operation, where $2 < \gamma < 20$. For optimum operation, the inventor has demonstrated from measurements and computer simulations that the breakdown voltage has to be approximately 8 times the punch-through voltage. Thus, assuming $$V_B = 8V_{PT} \text{ and } w = \frac{12 \times 10^5}{f}$$

where $f$ is the operating frequency of the device in Hertz and the width, $w$, of the active layer is in micrometers, an expression for the optimum slope of the impurity profile about the PN junction in the active region is $$a = \frac{24}{1 + 2\gamma} E_c \frac{\epsilon}{e} \left(\frac{f}{12 \times 10^5}\right)^2$$

where $a$ is in cm$^{-4}$ and $\gamma$ equals 8.

The width, $w$, necessary for the region 12 may be determined from the equation above (for $w$). For example, for TRAPATT operation at 3 GHz, a width $w$ of about 7 $\mu$m is necessary.

An optimal impurity profile 10 for a typical device is shown in FIG. 1. The abscissa X indicates substrate depth in micrometers. The ordinate indicates the net impurity density, as either net donor density ($N_D - N_A$) or net acceptor density ($N_A - N_D$), in atoms per cm$^3$. An important zone of the profile for the present novel indication is the span of an active region 12. In the region 12, a PN junction 14 is determined as the point of traversal of the impurity profile across the abscissa X. The slopes of the regions 16 and 18 within the region 12 determine the grading of the active region 12. The region 12 is sometimes referred to as the avalanche or depletion region. Region 12 is linearly graded when the slopes for regions 16 and 18 are identical. A diode for operation in the TRAPATT mode has an optimum grading when the actual slope of the active region 12 is equal to that indicated by the equation for slope, $a$, expressed above.

FIG. 2 is a flow diagram of the present novel method for the manufacture of a four-layer diode having a graded active region such as is shown in FIG. 1, the graded active region having a slope in accord with the equation for slope, $a$, expressed above.

Referring now to FIG. 2 and the corresponding stages in the preparation of the semiconductor device shown in FIGS. 3a–3f, the various steps are performed upon the surface of a lightly doped layer 20 of a wafer 22. Only a small portion of the wafer 22 is illustrated, the wafer 22 being typically comprised of flat mesas of silicon. The diameter of a mesa, for example, is about 100 to 500 $\mu$m. The mesas typically have a thickness of about 50 $\mu$m.

The method of the present invention may be used to produce either a P+PNN+ diode from a wafer comprising an N layer on an N+ layer or an N+NPP+ diode by starting with a P layer on a P+ layer. Preferably, these substrates comprise epitaxial N or P layers on a corresponding N+ or P+ layer, and have an impurity profile corresponding to the one shown in FIG. 4a. In the manufacture of a P+PNN+ diode, a substrate preparation step 24 (FIG. 2), provides a wafer at least 50 $\mu$m in thickness comprised of a 12 $\mu$m epitaxial P original layer adjacent to a supporting heavily doped P+ original layer. The impurity profile of the resultant wafer 22 (FIG. 3a) is indicated in FIG. 4a and the P epitaxial layer 20 is shown lightly doped with an impurity concentration of $1 \times 10^{15}$ cm$^{-3}$. A layer 26 is heavily doped P+ to an impurity concentration of $10^{19}$ cm$^{-3}$. It is necessary for the epitaxial layer 20 to have a depth of no more than 12 $\mu$m to insure that the active region 12 (FIG. 1) is sufficiently close to the surface of the layer 20 to efficiently dissipate heat. This depth also allows for the aforementioned width of 7 $\mu$m for the active region 12 (FIG. 1) necessary for 3 GHz operation of the diode.

For TRAPATT mode operation of the diode, computer simulation and investigation by the inventor has determined that a peak of the order of $10^{15}$ atoms per cm$^3$ for the slope of the impurity profile in the active region (region 12 in FIG. 1) is necessary. To achieve this peak, the initial impurity concentration of the diffusion layer must be approximately $5 \times 10^{16}$ atoms per cm$^3$ or less and the layer itself must be 1000A or less in thickness. This determination was based on the diffusion rates for phosphorus and boron in silicon. An ion implantation step 28 (FIG. 2) was devised because state of the art deposition methods such as the use of Emulsitone film or doped oxide deposition have not produced film impurity densities below $10^{16}$ atoms per cm$^3$ or thicknesses for these films less than 10,000A. The use of such methods for the deposition of the impurities for later formation of the impurity profile causes the peak of the profile for the region 16 to be very steep for this half of the region 12. The slope, $a$, of the impurity profile for the region 12 using these methods is, at most, approximately $5 \times 10^{19}$ cm$^{-4}$. Moreover, diodes fabricated from such methods generate no more than a 100 watt peak power output at 3 GHz operation.

The present method uses the ion implantation step 28 (FIG. 3b) to imbed phosphorus ions into the P–P+ wafer 22. The implantation is performed at an energy of 150 KeV and a flux density of $5.5 \times 10^{11}$ cm$^{-2}$. The inventor has discovered that a properly graded region may be obtained by implantation of the impurities to a depth not greater than 1000A. The peak ion density of the implantation is approximately $5 \times 10^{16}$ cm$^{-3}$. After the ion implantation step 28, an oxide formation 32 (FIG. 3c) is deposited on the wafer 22 to prevent out diffusion of the implanted ions shown diagrammatically at 34.

An oxide deposition 36 (FIG. 2) uses a silane SiH$_4$ source in oxygen at a temperature of 350° C for deposition to a thickness of 0.5 $\mu$m. Diffusion of the implanted ions 34 requires approximately eight hours at 1150° C in a suitable heating means 38 (FIG. 3d). During a thermal diffusion step 40 (FIG. 2) the atoms of the implanted ions 34 and boron atoms from the P+ layer 26 both diffuse into the P layer 20. The phosphorus and boron diffusion processes operate simultaneously to form a graded profile in the active region 12 about the PN junction 14 (see FIG. 1). The slope, α, produced by the above method of the present invention is $5 \times 10^{18} cm^{-4}$.

Referring now to FIG. 3e, to define the width of the active region a high density phosphorus doped silicon dioxide layer 42 is deposited on the surface of the device, from a silane source for example. The layer 20 has an impurity density of approximately $5 \times 10^{19} cm^{-3}$. A silane deposition step 44 (FIG. 2) uses procedures commonly known in the art. A diffusion step 46 (FIG. 2) for the phosphorus from the layer 12 requires approximately seven minutes at 1150° C in the heating means 38. FIG. 3f shows metal contacts 48 and 50 formed on the wafer 22.

FIGS. 4a and 4b show the impurity profiles of the diode in the major stages of manufacture. In FIG. 4a a P—P+ substrate exhibiting the profile 52 is ion implanted with donors 54 to a peak density of $10^{16} cm^{-3}$. In the next stage of the process the surface of the wafer is coated with an oxide 56 and the impurity donors 54 are diffused into the P layer of the profile 52 to form an impurity profile 58 shown in FIG. 4b. The profile 58 has a symmetrical slope about the abscissa X in the active region. However, the width of the active graded region about the PN junction 60 is not defined. The region extends to the surface of the wafer. Accordingly, the impurity deposition 44 of, for example, phosphorus, is diffused to change the impurity profile 58 to the desired impurity profile 10 shown in FIG. 1. Thermal diffusion 46 of the donor impurities from the deposition 44 defines the active region 12 to the necessary width for TRAPATT operation. An area 62 illustrates the addition of the donor impurities which were diffused into the substrate to form the symmetrical impurity profile 10.

As shown in FIG. 1, the device of the present invention is therefore comprised of a first layer of semiconductor material of N-type conductivity exhibiting the profile portion 16 and a second layer of semiconductor material of P-type conductivity exhibiting the profile portion 18. A third layer of the semiconductor formed from the orginal P layer exhibits a profile portion 64. A fourth layer of the semiconductor which remains after the last diffusion and which is comprised of a portion of the original P+ layer exhibits a profile portion 66.

FIG. 5 shows a theoretical log C-log V characteristic of a 3 GHz diode of the present invention where V is the diffusion voltage $V_d$ plus the reverse applied voltage $V_r$. $V_{PT}$ is the punch-through voltage. $V_B$ is the breakdown voltage. The slope in the log C-log V plot is approximately ⅛. This indicates that the diode has a linearly graded junction in accordance with the equation for the slope, α, introduced above, where γ is equal to 8. The slope of the impurity gradient calculated from capacitance-area measurements of the diode is approximately $5.8 \times 10^{18} cm^{-4}$. The depletion layer width is approximately 7.1 μm. Thus, in the example given, a process for producing an optimum impurity profile for a four-layer diode for 3 GHz TRAPATT operation, and such a diode itself is provided. The ion implanted 3 GHz diode has provided 150-200 watt peak power output and has demonstrated at 50 μm pulse width with 90 watt power output and 10 dB gain. A 300 MHz band width has been demonstrated.

What is claimed is:

1. A method for making a diode for optimum operation in the TRAPATT mode, the diode having several layers of a semiconductor including two innermost layers, the two innermost layers forming a PN junction close to a surface of the diode, the diode having an impurity profile about the PN junction in the two innermost layers, the profile exhibiting the same slope on each side of the PN junction, said method comprising the steps of:
   a. implanting impurities of a first conductivity type into a lightly doped original layer of a second conductivity type, the original layer being located on a heavily doped semiconductor wafer having impurities of the second conductivity type, up to a density of the order of $5 \times 10^{16}$ atoms-$cm^{-3}$;
   b. depositing on the original layer a means for preventing out-diffusion of the implanted impurities;
   c. diffusing the implanted impurities into the original layer;
   d. simultaneously diffusing the impurities in the heavily doped wafer into the original layer during the diffusion of the implanted impurities whereby the PN junction is formed in the original layer;
   e. thereafter removing said means for preventing out-diffusion from said original layer; and
   f. diffusing impurities of the first conductivity type into the original layer.

2. The method of claim 1 wherein the means for preventing out-diffusion of the implanted impurities comprises an oxide located adjacent the lightly doped original layer.

3. The method of claim 2, wherein the implanted impurities of the first conductivity type are created by ionic bombardment of like impurity ions.

4. The method of claim 3, wherein the impurities of the first conductivity type are implanted in the original layer to depth not exceeding approximately 1000Å.

5. The method of claim 4 further comprising the steps of depositing impurities of a first conductivity type on the original layer up to a density of the order of $10^{19}$ atoms/$cm^{-3}$ and thermally diffusing the deposited impurities.

6. The method of claim 5, wherein the step of diffusing the implanted impurities further includes thermally diffusing the implanted impurities over a period of approximately 8 hours.

7. The method of claim 4, wherein the ionic bombardment occurs at a flux density of approximately $5 \times 10^{14}$ ions/$cm^2$.

8. The method of claim 7, wherein the original layer is approximately 12 μm thick and wherein the wafer is approximately 50 μm thick.

9. The method of claim 8, wherein in the step of implanting impurities, phosphorus ions are implanted into the original layer, the wafer being doped with boron.

10. The method of claim 8, wherein the step of implanting impurities, boron ions are implanted into the original layer, the wafer being doped with phosphorus.

* * * * *